United States Patent
Yan et al.

(10) Patent No.: US 8,963,639 B2
(45) Date of Patent: Feb. 24, 2015

(54) FREQUENCY COMPENSATION TECHNIQUES FOR LOW-POWER AND SMALL-AREA MULTISTAGE AMPLIFIERS

(71) Applicant: University of Macau, Macau (CN)

(72) Inventors: Zushu Yan, Macau (CN); Pui-In Mak, Macau (CN); Man-Kay Law, Macau (CN); Rui Paulo da Silva Martins, Macau (CN)

(73) Assignee: University of Macau, Macau (CN)

( * ) Notice: Subject to any disclaimer, the term of this patent is extended or adjusted under 35 U.S.C. 154(b) by 69 days.

(21) Appl. No.: 13/770,020

(22) Filed: Feb. 19, 2013

(65) Prior Publication Data
US 2014/0232465 A1 Aug. 21, 2014

(51) Int. Cl.
*H03F 3/45* (2006.01)
(52) U.S. Cl.
CPC ...... *H03F 3/45192* (2013.01); *H03F 2200/408* (2013.01); *H03F 2203/45631* (2013.01); *H03F 2203/45674* (2013.01)
USPC .......................................... 330/260; 330/292
(58) Field of Classification Search
USPC ............................. 330/252–261, 98–100, 292
See application file for complete search history.

(56) References Cited

U.S. PATENT DOCUMENTS 6,084,475 A * 7/2000 Rincon-Mora ............... 330/255
7,414,473 B1 * 8/2008 Rayanakorn et al. ......... 330/255

OTHER PUBLICATIONS

Zushu Yan; Pui-In Mak; Man-Kay Law; Rui Paulo Da Silva Martins, "A 0.016mm2 144μW three-stage amplifier capable of driving 1-to-15nF capacitive load with >0.95MHz GBW", in Proc. of 2012 IEEE International Solid-State Circuits Conference Digest of Technical Papers (ISSCC), pp. 368-370, San Francisco, U.S.A, Feb. 19-23, 2012.

* cited by examiner

*Primary Examiner* — Hieu Nguyen
(74) *Attorney, Agent, or Firm* — Bacon & Thomas, PLLC

(57) ABSTRACT

A three stage amplifier is provided and the three stage amplifier comprises a first gain stage, a second gain stage and a third gain stage wherein said first stage receives an amplifier input signal and said third gain stage outputs an amplifier output signal. The amplifier includes a feedback loop having a current buffer and a compensation capacitance provided from the output of said third gain stage to the output of the first gain stage. In addition, an active left half plane zero stage is embedded in said feedback loop for cancelling a parasitic pole of said feedback loop.

16 Claims, 6 Drawing Sheets

FREQUENCY COMPENSATION TECHNIQUES FOR LOW-POWER AND SMALL-AREA MULTISTAGE AMPLIFIERS

BACKGROUND OF THE INVENTION

1. Field of the Invention

The present invention is related to an amplifier, and, in particular, to an amplifier with small power and area.

2. Description of the Related Art

High-color-depth LCD drivers demand an extensive number of amplifiers to buffer the Gamma-corrected reference voltages, which have to be stabilized by nF-range capacitors to handle the glitch energy during the digital-to-analog conversion. To deal with such a large capacitive load (CL), most commercial buffer amplifiers require an external resistor (e.g., 20Ω for CL=10 nF) in series with the output for ringing reduction. This regrettably penalizes the cost, settling time and high-frequency gain droop.

SUMMARY OF THE INVENTION

The present invention is directed to a three stage amplifier. The three stage amplifier includes first, second and third gain stages wherein said first stage receives an amplifier input signal and said third gain stage outputs an amplifier output signal. According to an embodiment of the invention, the three stage amplifier includes a feedback loop having a current buffer and a compensation capacitance provided from the output of said third gain stage to the output of the first gain stage. An active left half plane zero stage is embedded in said feedback loop for cancelling a parasitic pole of said feedback loop.

According to an embodiment of the invention, the active left half plane zero stage includes two gain stages, and the feedback loop includes a resistance and a second compensation capacitance.

According to an embodiment of the invention, an active left half plane zero stage is embedded inside the third stage.

According to an embodiment of the invention, said three gain stages in are negative gain stages.

According to an embodiment of the invention, the amplifier comprises a feedforward transconductance stage extending from the output of first gain stage to the output of said three stage amplifier.

According to an embodiment of the invention, an active left half plane zero stage is embedded inside the second stage.

According to an embodiment of the invention, an active left half plane zero stage is embedded inside the output stage.

According to an embodiment of the invention, a feedforward transconductance stage is extending from the output of said first gain stage to the output of said third gain stage.

According to an embodiment of the invention, an active left half plane zero stage embedded in the second stage for cancelling a parasitic pole of said feedback loop.

Accordingly, the present invention provides a three-stage amplifier which is optimized via combing a frequency compensation circuit and an active left-half plane zero circuit to extend the drivability of the present invention with small power and area.

Further features and aspects of the present invention will become apparent from the following detailed description of embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 5a shows a measured step response at CL=0.5 nF of the amplifier 200 according to an embodiment of the invention.

FIG. 5b shows an enlarged waveform in a portion A of FIG. 5a.

FIG. 5c shows the simulated gain and phase margins of the amplifier 200 according to an embodiment of the invention.

DESCRIPTION OF THE EMBODIMENTS

Various exemplary embodiments, features, and aspects of the invention will be described in detail below with reference to the drawings. For the drawings below, the same or the similar numbers and symbols are referred to the same or the similar elements.

Figure 1A:
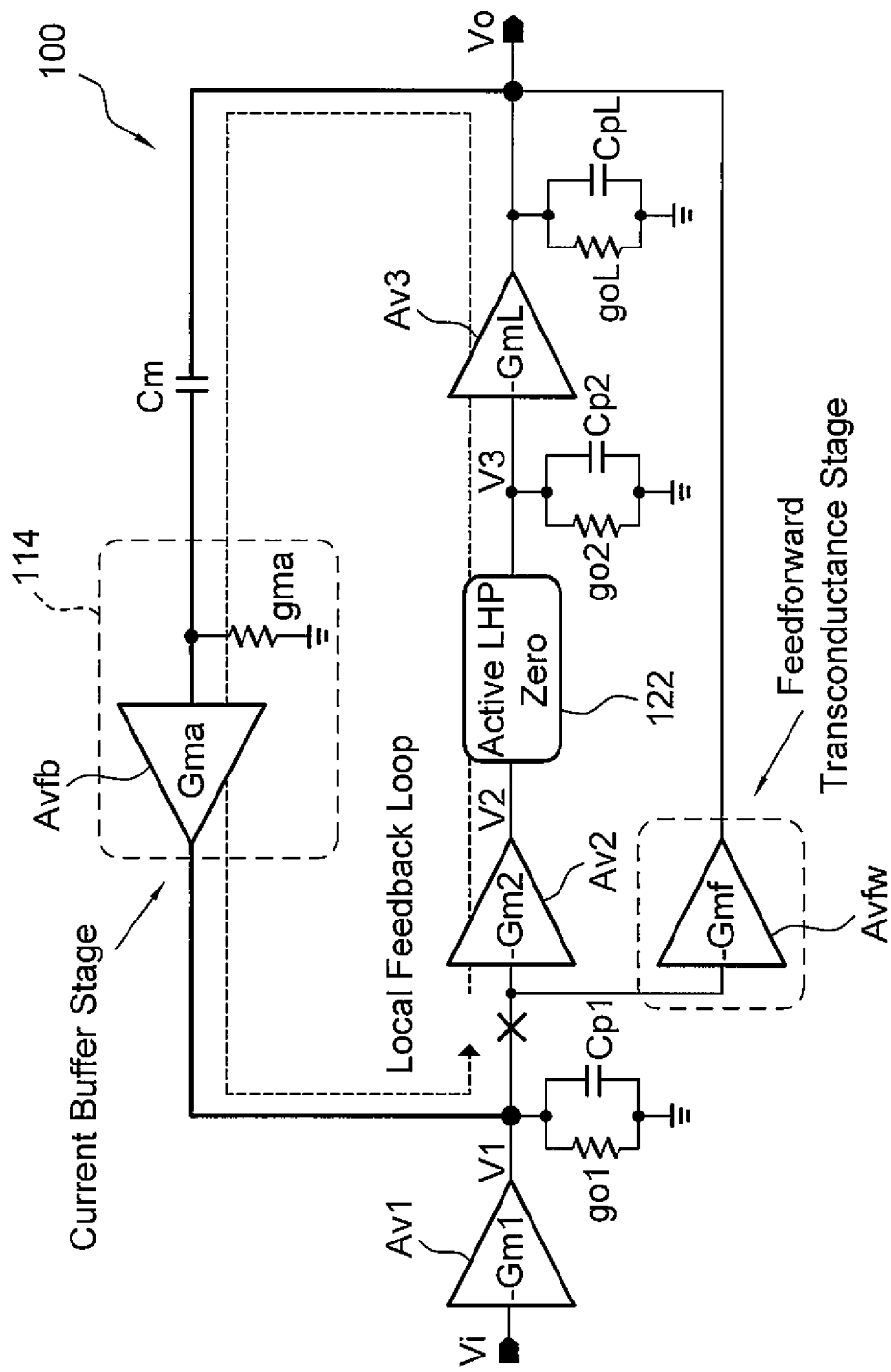
FIG. 1a shows a schematic circuit diagram illustrating the structure of a three stage amplifier 100 according to an embodiment of the invention.

FIG. 1a shows a schematic circuit diagram illustrating the structure of a three stage amplifier 100 according to an embodiment of the invention. Referring to FIG. 1a, the three stage amplifier 100 comprises three main gain stages Av1, Av2, and Av3. In addition to the three main gain stages, the three stage amplifier 100 further comprises a feedforward transconductance stage Avfw, an active left half plane zero stage 122, a current buffer stage 114 and a Miller compensation capacitance Cm. Besides, there exists parasitic capacitances Cp1, Cp2, and parasitic transconductance resistances go1, go2, goL.

The gain stage Av1 receives an amplifier input signal Vi and generates a signal V1 depending on a negative transconductance gain −Gm1. The gain stage Av2 is coupled to the gain stage Av1 and receives the signal V1 and generates a signal V2 depending on a negative transconductance gain −Gm2. The gain stage Av3 is coupled to the gain stage Av2 and generates an amplifier output signal Vo depending on a negative transconductance gain −GmL. In addition, the parasitic capacitance Cp1 and the parasitic transconductance resistance go1 parasitize between an output of the gain stage Av1 and ground respectively; the parasitic capacitance Cp2 and the parasitic transconductance resistance go2 parasitize between an output of the gain stage Av2 and ground respectively; and the parasitic transconductance resistance goL parasitizes between an output of the gain stage Av3 and ground, wherein a load capacitance CL is coupled between the output of the gain stage Av3 and ground too.

A local feedback loop goes from the output of the gain stage Av3 to the input of the gain stage Av3 with the Miller compensation capacitance Cm coupled between the gain stages Av2 and Av3. The active left half plane zero stage 122 can be coupled anywhere on the path of the feedback loop for contributing frequency compensation to the amplifier output signal Vo, that is, the active left half plane zero stage 122 is embedded in the feedback loop for cancelling a parasitic pole of the feedback loop. According to an embodiment of FIG. 1a, the active left half plane zero stage 122 is coupled on the path where the gain stage Av3 is coupled to the gain stage Av2, and sending a signal V3 to the gain stage Av3 by compensating the signal V2.

Figure 1B:
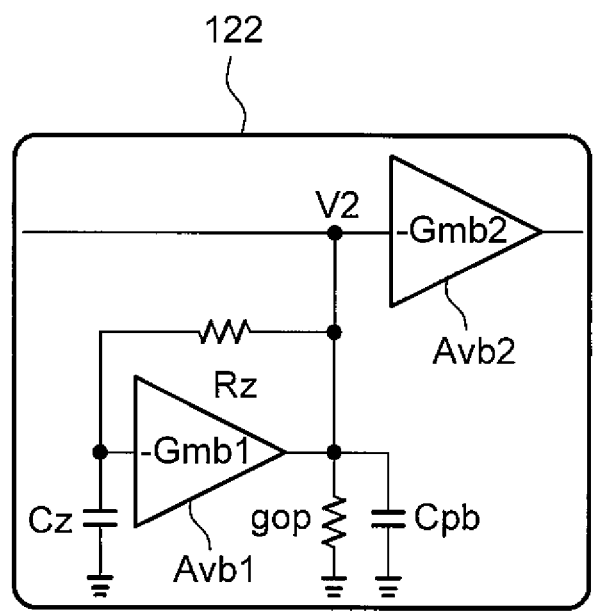
FIG. 1b shows a schematic circuit diagram of the active Left half plane zero stage 122 according to an embodiment of the invention.

Specifically, please refer to FIG. 1b wherein FIG. 1b shows a schematic circuit diagram of the active Left half plane zero stage 122 according to an embodiment of the invention. The active left half plane zero stage 122 further includes gain stages Avb1, Avb2 having negative transconductance gain −Gmb1 and −Gmb2 respectively, a capacitance Cz and a resistance Rz. In addition, a parasitic capacitance Cpb and a parasitic transconductance resistance gop parasitize between an output of the gain stage Avb1 and ground respectively. Moreover, the capacitance Cz is coupled between an input of the gain stage Avb1 and ground. The resistance Rz is coupled between the input and the output of the gain stage Avb1. Besides, the gain stage Avb2 is coupled to the gain stage Avb1 and receives the signal V2.

Please refer to both FIG. 1a and FIG. 1b. The current buffer stage 114 is also coupled on the path of the local feedback loop for avoiding the bandwidth reduction originated from the RC network in the three stage amplifier 100. According to an embodiment of the invention, the current buffer stage 114 includes a gain stage Avfb with a transconductance gain Gma and a parasitic transconductance resistance gma. An input of the gain stage Avfb is coupled to the Miller compensation capacitance Cm and an output of the gain stage Avfb is coupled to the gain stage Av2. In addition, the parasitic transconductance resistance gma exists between the input of the gain stage Avfb and ground.

According to an embodiment of the invention, the amplifier 100 uses the feedforward transconductance stage Avfw to make gain compensation for the amplifier output signal Vo. Further, the feedforward transconductance stage Avfw has a negative transconductance gain gin −Gmf and is coupled between the outputs of the gain stages Av1 and Av3.

According to an embodiment of FIG. 1a and FIG. 1b, the LFL (local feedback loop) transfer function of the three stage amplifier 100 can be obtained, $$T_{Proposed}(s) \approx -\frac{sG_{m2}G_{mL}C_m}{g_{o2}g_{oL}\left(s\frac{C_L}{g_{oL}}\right)\left(s\frac{C_{p1}}{g_{o1}}\right)\left(1+s\frac{C_z}{G_{mb1}}\right)\left(\frac{1+sR_zC_{pb}}{}\right)\left(1+s\frac{C_m}{G_{mo}}\right)} \quad (1)$$

From the equation above, two new poles P1 (Gmb1/Cz) and P2 (1/RzCpb) are introduced by the active LHP (left half plane) zero stage. The LFL's UGB (Unit Gain bandwith) ωμ,proposed is expressed by, $$\omega_{\mu,Proposed} = G_{m2}R_z\frac{C_m}{C_{p1}}\frac{C_2}{C_{p2}}\frac{G_{mL}}{C_L}.$$

This extended ωμ,proposed can be exchanged for a higher CL drivability without power and area penalty.

For simplicity, the influences of $P_2$ and $P_3$ on the LFL are first ignored. Assuming that K is the ratio of $P_1$ to $\omega_{\mu,Proposed}$, the LFL's PM can be approximately given by, $$PM_{LFL} \approx 90° - \arctan\frac{\omega_{\mu,Proposed}}{P_1} = 90° - \arctan\frac{1}{K}.$$

The amplifier's transfer function can be obtained with the aid of the signal-flow graph (SFG) and driving-point impedance (DPI) methodology as given by, $$A_{Proposed}(s) \approx \quad (2)$$

$$\frac{A_{DC}\left(1+\frac{s}{A_f \cdot P_1}+\frac{s^2}{A_f \cdot P_1 \cdot P_2}\right)\left(1+\frac{s}{P_3}\right)}{\left(1+\frac{s}{\omega_{pd}}\right)\left(1+\frac{s}{\omega_{\mu,Proposed}}+\frac{s^2}{\omega_{\mu,Proposed} \cdot P_1}+\frac{s^3}{\omega_{\mu,Proposed} \cdot P_1 \cdot P_2}+\frac{s^4}{\omega_{\mu,Proposed} \cdot P_1 \cdot P_2 \cdot P_3}\right)} \approx$$

$$\frac{A_{DC}}{\left(1+\frac{s}{\omega_{pd}}\right)\left(1+2\zeta\left(\frac{s}{\omega_n}\right)+\left(\frac{s}{\omega_n}\right)^2\right)} =$$

$$\frac{A_{DC}}{\left(1+\frac{s}{\omega_{pd}}\right)\left(1+\frac{s}{\omega_{\mu,Proposed}}+\frac{s^2}{K \cdot \omega_{p,Proposed}^2}\right)}$$

where $A_f$ is $(G_{m2}G_{mL}/G_{mf}g_{o2})$, $A_{DC}$ is the DC gain $(G_{m1}G_{m2}G_{mL}/g_{o1}g_{o2}g_{oL})$, and $\omega_{pd}$ is the dominant pole $(g_{o1}g_{o2}g_{oL}/C_mG_{m2}G_{mL})$. Hence, the GBW is $(G_{m1}/C_m)$. The damping factor $\zeta$ and natural frequency $\omega_n$ of the second-order polynomial in the denominator of (2) can be characterized by the LFL parameters $\omega_{\mu,Proposed}$ and K, which are manifested as, $$\zeta = \frac{\sqrt{K}}{2} \qquad \omega_n = \sqrt{K}\,\omega_{\mu,Proposed}$$

The exact relationship among GBW, $\zeta$, and $\omega_n$ can be determined by a proper set of coefficients for the denominator of the $3^{rd}$-order closed-loop transfer function, which is obtained by configuring the amplifier in unity-gain feedback (e.g., Butterworth coefficients). Alternatively, a more design-oriented approach is to link up the LFL parameters ($\omega_{\mu,Proposed}$ and $PM_{LFL}$) to those of the amplifier (GBW and PM) as given by, $$PM_{Overall} \approx 90° - \arctan\frac{2\zeta\left(\frac{GBW}{\omega_n}\right)}{1-\left(\frac{GBW}{\omega_n}\right)^2} = \quad (3)$$

$$90° - \arctan\frac{-\frac{GBW}{\omega_{\mu,Proposed}}}{1 - \frac{1}{\tan(PM_{LFL})}\left(\frac{GBW}{\omega_{\mu,Proposed}}\right)^2}.$$

With the given GBW, $PM_{LFL}$ and $PM_{Overall}$, it is possible to determine $\omega_{\mu,Proposed}$ from the equation. Other parameters should be optimized to achieve the desired GBW by pushing up other LFL non-dominant poles ($P_{1-3}$). Here, to achieve 76° $PM_{LFL}$ and $PM_{Overall}$, $P_1$ is located 4× higher than $\omega_{\mu,Proposed}$ ($\zeta=1$), and $\omega_{\mu,Proposed}$ is set as 4× of the GBW. If $P_2$ ($P_3$) is 5× (10×) beyond $\omega_{\mu,Proposed}$, $R_z$ can be determined by the estimated $C_{pb}$. $G_{ma}$ is set as 40× of $G_{m1}$. Although this arrangement degrades $PM_{LFL}$ by 17.1°, the impact on $PM_{Overall}$ is only 4.3° as long as $\omega_{\mu,Proposed}$ is 4× of the GBW. The optimization of $G_{m2}$ and $G_{mL}$ involves the power tradeoff between the 2$^{nd}$ and 3$^{rd}$ stages, and can be obtained by the estimated $C_{p1}$ and $C_{p2}$. Finally, $G_{mf}$ should match $G_{mL}$ for realizing a symmetric output stage.

The SR (slew rate) of the proposed amplifier 100 is mainly constrained by those of the first and final stages since the lumped parasitic capacitance Cp2 is much smaller than Cm and CL. Like most three-stage amplifiers, the SR is not limited by the push-pull output stage if CL<5 nF (in the designed amplifier) as given by, $$SR \approx \frac{I_1}{C_m} \quad (4)$$

where I1 is the (dis)charging current for Cm. If CL is further increased, the SR of the output stage dominates as its dynamic current is not adequate to support fast slewing. Thus, the SR of the proposed amplifier 100 can be expressed as, $$SR \approx \frac{I_{o,max}}{C_L}, \quad (5)$$

where Io,max denotes the maximum output current available to (dis)charge CL. In parasitic-pole cancellation any component variations can lead to pole-zero mismatch. As a consequence, if the resulting doublet is located well below the unity-gain frequency of the amplifier 100, it will introduce a slow-settling component whose magnitude is proportional to the doublet frequency, and inversely proportional to the doublet spacing. Since the parasitic-pole cancellation is applied within the LFL, the doublet spacing is roughly compressed by the LFL's loop gain at the doublet frequency, which is 20 dB for CL=10 nF and increases as CL decreases in the designed amplifier. Hence, the impact of the parasitic-pole cancellation on the transient response is greatly suppressed.

After the impact of the doublet is ignored, the simplified 3rd-order transfer function (2) can help to analyze the linear settling behavior, which can be fully determined by the three open-loop parameters: GBW, $\zeta$, and $\omega$n. As the gain margin (GM) of the amplifier 100 can be given by, $$GM_{Overall} \approx 20\log\frac{2\zeta}{\left(\frac{GBW}{\omega_n}\right)},$$

together with the PMoverall (3) and the GBW they set the pattern for the linear settling. Specifically, for a given ratio of GBW to $\omega$n a large GMoverall implies a large $\zeta$, thus introducing less ringing on the step response.

Figure 2:
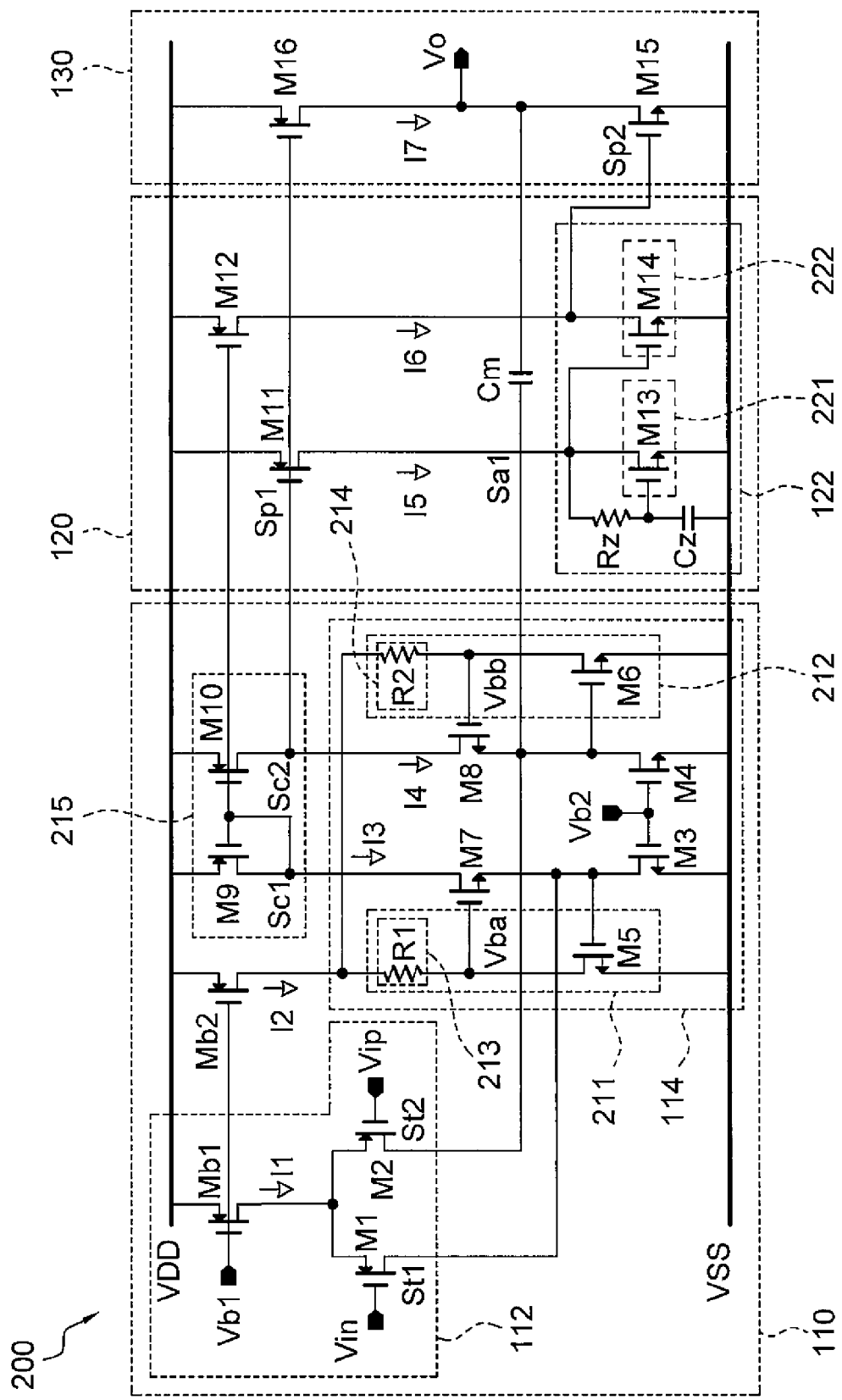
FIG. 2 shows a detailed schematic block diagram of an amplifier 200 by realizing the three stage amplifier 100 according to an embodiment of the invention.

FIG. 2 shows a detailed schematic block diagram of an amplifier 200 by realizing the three stage amplifier 100 according to an embodiment of the invention. Please note that there may be different reference numbers or symbols which are referred to the same elements in FIG. 1a and FIG. 1b, because we will have a different functional view about the amplifier 200. However, the same reference numbers and symbols are still referred to the same elements. Additionally, all the parasitic capacitances (Cp1, Cp2) and parasitic transconductance resistances (go1, go2, gop, gma) which are shown in FIGS. 1a and 1b are not shown in FIG. 2 because they parasitize inside transistors.

Referring to FIG. 2, the amplifier 200 includes a current transferring amplifying unit 110, a frequency compensation unit 120, an output driving unit 130, and a Miller compensation capacitance Cm (which is corresponding to Cm of FIG. 1a). Further, the current transferring amplifying unit 110 includes a current buffer circuit 114 (which is corresponding to the current buffer stage 114 of FIG. 1a) embedded inside the current transferring amplifying unit 110. In addition, the frequency compensation unit 120 includes an active left half plane zero circuit 122 (which is corresponding to active left half plane zero stage 122 of FIG. 1a) embedded thereof.

According to an embodiment of the invention, the current transferring amplifying unit 110 could be regarded as a first gain stage. The current transferring amplifying unit 110 receives an input signals Vin, Vip (which are corresponding to the signal V1 of FIG. 1a) and generates a first stage output signal Sp1 (which is corresponding to the signal V2 of FIG. 1a) with a gain Gm1 (which is corresponding to −Gm1 of FIG. 1a). In other words, the current transferring amplifying unit 110 amplifies the input signals Vin, Vip to generate the first stage output signal Sp1 with the gain Gm1 at the output thereof. Then, the current buffer circuit 114 contributes at least a part of gain component Gma (which is corresponding to Gma of FIG. 1a) to the gain Gm1.

The frequency compensation unit 120 is coupled to the current transferring amplifying unit 110 and receives the first stage output signal Sp1. The frequency compensation unit 120 includes an active left half plane zero circuit 122 and makes frequency compensation on the first stage output signal Sp1 to generate the second stage output signal Sp2. That is, the active left half plane zero circuit 122 can e.g. generate a LHP (left half plane) zero for parasitic-pole cancellation to perform frequency compensation (i.e. to provide a high frequency response) on the first stage output signal Sp1.

The output driving unit 130 is coupled to the frequency compensation unit 120 and receives the second stage output signal Sp2. The output driving unit 130 receives the second stage output signal Sp2 to drive the third stage output signal Vo (which is also an output signal of the amplifier 200) at an output of the amplifier 200 according to the second stage output signal Sp2. In addition, the Miller compensation capacitance Cm is coupled between the output of the amplifier 200 and an input of the current buffer circuit 114.

Specifically referring to FIG. 2, the current transferring amplifying unit 110 further includes a differential input port 112 and the differential input port 112 receives a pair of input differential signals Vin and Vip. In FIG. 2, the differential input port 112 transports transporting signals St1 and St2 to the current buffer circuit 114 according to the input signals Vin and Vip. Specifically, the input port 112 includes a transistor M1 (e.g. a P-type transistor), a transistor M2 (e.g. a P-type transistor), and a transistor Mb1 (e.g. a P-type transistor). The transistors M1, M2, and Mb1 include e.g. a source, a drain and a gate. The gate of the transistor M1 receives the input signal Vin and the transporting signal St1 is generated at the drain of the transistor M1. The gate of the transistor M2 receives the input signal Vip and the transporting signal St2 is generated at the drain of the transistor M2. In addition, the gate of the transistor Mb1 receives a bias voltage Vb1, and the source of the transistor Mb1 receives a power voltage VDD, and the drain of the transistor Mb1 is coupled to both the sources of the transistors M1 and M2. Besides, the bias voltage Vb1 could be provided properly to the transistor Mb1 so as to drive a suitable current I1 for the differential input port 112.

According to the embodiment of FIG. 2, the current buffer circuit 114 includes a transistor M3 (e.g. an N-type transistor), a transistor M4 (e.g. an N-type transistor), a transistor M7 (e.g. an N-type transistor) and a transistor M8 (e.g. an N-type transistor). The transistors M3, M4, M7 and M8 include e.g. a source, a drain and a gate. The source of the transistor M3 receives a ground voltage VSS, the gate of the transistor M3 receives a bias voltage Vb2, and the drain of the transistor M3 receives the transporting signal St1. The source of the transistor M4 receives a ground voltage VSS, the drain of the transistor M4 receives the bias voltage Vb2, and the drain of the transistor receives the transporting signal St2. The source of the transistor M7 receives the transporting signal St1, the gate of the transistor M7 receives a bias voltage Vba, and the drain of the transistor M7 generates a current buffer signal Sc1. Additionally, the source of the transistor M8 receives the transporting signal St2, the gate of the transistor M8 receives a bias voltage Vbb, and the drain of the transistor M8 generates a current buffer signal Sc2. With respect to the transporting signals St1 and St2, the current buffer signals Sc1 and Sc2 are generated and amplified with a gain GMA.

According to the embodiment of FIG. 2, the current transferring amplifying unit 110 further includes a cascode amplifying circuit 215. The cascode amplifying circuit 215 also helps to amplify the differential current buffer signals Sc1 and Sc2 to generate the first stage output signal Sp1. Specifically, the cascode amplifying circuit 215 includes a transistor M9 (e.g. a P-type transistor) and a transistor M10 (e.g. a P-type transistor). The transistors M9 and M10 have e.g. a source, a gate and a drain. The drain of the transistor M9 receives the current buffer signal Sc1, the gate of the transistor M9 is coupled to the drain of the transistor M9, and the source of the transistor M9 receives a power voltage VDD. The drain of the transistor M10 receives the current buffer signal Sc2, the gate of the transistor M10 is coupled to the gate of the transistor M9, and the source of the transistor M10 receives a power voltage VDD. In response to the received current buffer signals Sc1 and Sc2, the first stage output signal Sp1 is generated at the drain of the transistor M10 with a gain Gm1. Besides, a very large gain value for the gain Gma is desired to push a pole P3 (which is corresponding to P3 in the embodiment of FIGS. 1a and 1b) to a high frequency.

Figure 3:
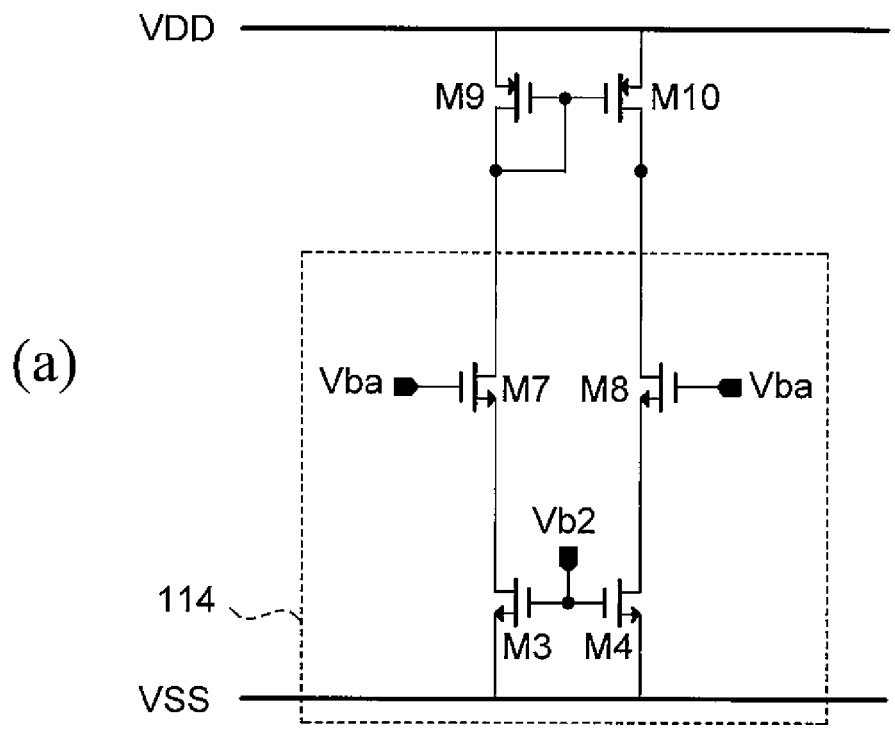
FIG. 3a shows an exemplary schematic view of the current buffer circuit 114 according to an embodiment of the invention.
FIG. 3b shows an exemplary schematic view of the current buffer circuit 114 according to an embodiment of the invention.
Figure 3:
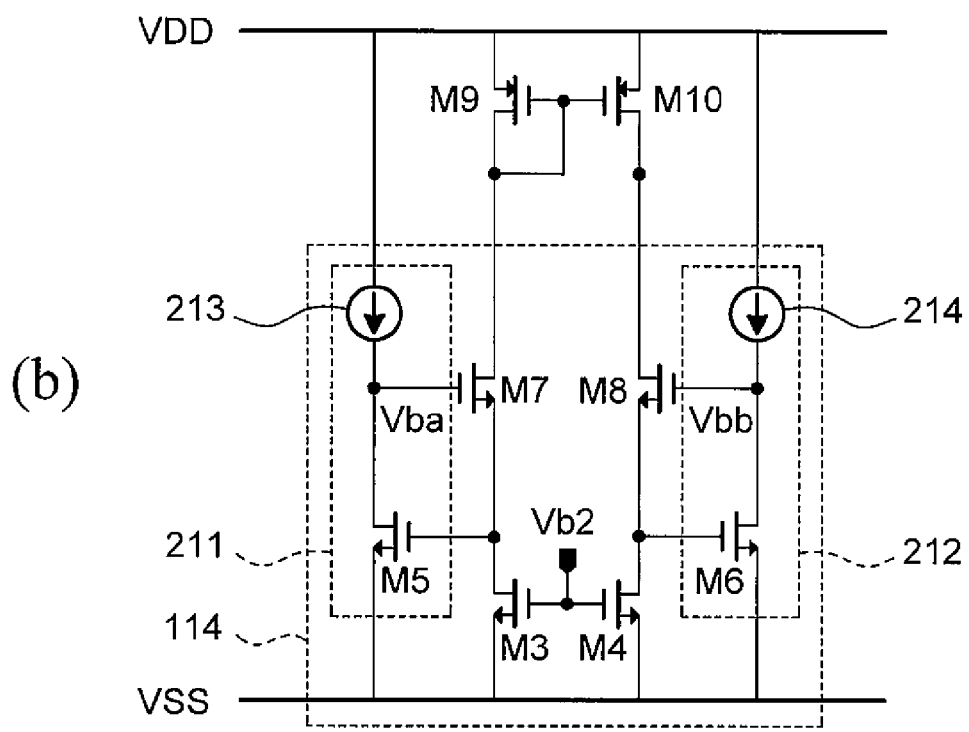

FIG. 3a shows an exemplary schematic view of the current buffer circuit 114 according to an embodiment of the invention. Referring to FIG. 3a, the current buffer circuit 114 includes transistors M3, M4, M7 and M8 wherein the coupling relation among the transistors M3, M4, M7 and M8 is similar to the coupling relation of those transistors in the current buffer circuit 114 of FIG. 2 and will not repeat herein again. Both the gates of the transistors M3 and M4 receive a bias voltage Vb2 and both the gates of the transistors M7 and M8 receive a bias voltage Vba. Accordingly, the gates of the transistors M7 and M8 are located at the same voltage level and thus a common gate design for the current buffer circuit 114 is achieved. In this embodiment, the transistor M8 is regarded as a simple current buffer. Therefore, the current buffer circuit 114 will draw considerable power to achieve the large gain Gma.

FIG. 3b shows an exemplary schematic view of the current buffer circuit 114 according to an embodiment of the invention. Referring to FIG. 3b, the current buffer circuit 114 includes transistors M3, M4, M7 and M8 wherein the coupling relation among the transistors M3, M4, M7 and M8 is similar to the coupling relation of those transistors in the current buffer circuit 114 of FIG. 2 and will not repeat herein again. The gate of the transistor M7 receives a bias voltage Vba and the gate of the transistor M8 receives a bias voltage Vbb wherein the bias voltage Vba is provided from a bias circuit 211 and the bias voltage Vbb is provided from a bias circuit 212. According to an embodiment of the invention, the bias circuit 211 includes a current source 213 and a transistor M5 (e.g. an N-type transistor). The transistor M5 has e.g. a gate, a drain and a source. The source of the transistor M5 receives a ground voltage VSS, and the gate of the transistor M5 is coupled to the source of the transistor M7. In addition, the current source 213 is coupled between a power voltage VDD and the drain of the transistor M5. According to an embodiment of the invention, the bias circuit 212 includes a current source 214 and a transistor M6 (e.g. an N-type transistor). The transistor M6 has e.g. a gate, a drain and a source. The source of the transistor M6 receives a ground voltage VSS, and the gate of the transistor M6 is coupled to the source of the transistor M8. Besides, the current source 214 is coupled between a power voltage VDD and the drain of the transistor M6. Since the bias voltages Vba and Vbb are regulated according to the currents through the current source 213 and 214 respectively, a regulated design for the current buffer circuit 114 is achieved. In this embodiment, the transistors M6 and M8 are formed as a regulated current buffer. Therefore, the gain GMA is boosted by a factor of (gm6*ro6+1), wherein gm6 is a gain parameter of the transistor M6 and ro6 is the internal resistance of the transistor M6.

Now, please return back to FIG. 2. The current buffer circuit 114 further includes bias circuits 211 and 212 wherein the bias circuits 211 and 212 are a regulated design as the embodiment of FIG. 3b and the coupling relation among the bias circuits 211 and 212 and the current sources 213 and 214 is similar to the coupling relation among those in FIG. 3b and thus will not repeat herein again. In a simple implement, the current sources 213 and 214 can include resistances R1 and R2 respectively. According to an embodiment of the invention, the current transferring amplifying unit 110 further includes a transistor Mb2 (e.g. a P-type transistor) coupled between a power voltage VDD and the bias circuits 211 and 212. Specifically, the transistor Mb2 has e.g. a source, a drain and a gate. The source of the transistor Mb2 receives a power voltage VDD, the gate of the transistor Mb2 receives the bias voltage Vb1, and the drain of the transistor Mb2 is coupled to terminals of the resistances R1 and R2. Since the gate of the transistor Mb2 receives the same bias voltage Vb1 as the gate of transistor Mb1 does, the current I2 which is flowing into the resistances R1 and R2 can be regulated according to the current I1. Also, since the current I2 flows into both the bias circuits 211 and 212, a current I3 flowing through the transistor M7 and a current I4 flowing through the transistor M8 will be adjusted according to the current I1 or I2.

Noteworthily, in the embodiment of FIG. 2, the transistors M5 and M6 and the resistances R1 and R2 are formed as a local feedback loop (LFL) which can provide a better controlled LFL gain (2*gm5*R1+1) with the moderately sized resistance R1, wherein gm5 is the transconductance gain of the transistor M5. The output impedance of the transistor M8 is also boosted by the LFL gain. The employed gain GMA in the embodiment of FIG. 2 balances the tradeoff between the gain Gma and bandwidth.

According to an embodiment of the invention, the frequency compensation unit 120 could be regarded as a second gain stage. The frequency compensation unit 120 receives the first stage output signal Sp1 and generates the second stage output signal Sp2 with a gain Gm2 (which is corresponding to −Gm2 of FIG. 1a) with respect to the first stage output signal Sp1. According to an embodiment of FIG. 2, in addition to the active left half plane zero circuit 122, the frequency compensation unit 120 further comprises a transistor M11 (e.g. a P-type transistor) and a transistor M12 (e.g. a P-type transistor). The transistors M11 and M12 (which are corresponding to the gain stage Av2 of FIG. 1a) have e.g. a source, a gate and a drain. The source of the transistor M11 receives the power voltage VDD, the gate of the transistor M11 receives the first stage output signal Sp1, and the drain of the transistor M11 generates a compensating signal Sa1. The source of the transistor M12 receives a power voltage VDD and the gate of the transistor M12 is coupled to the gate of the transistor M9. Connecting the gate of the transistor M9 to that of the transistor M12 results in a push-pull stage for the frequency compensation unit 120 so as to enhance the slew rate (SR) at the output of the frequency compensation unit 120.

According to an embodiment of FIG. 2, the active left half plane zero circuit 122 includes a capacitance Cz, a resistance Rz, and two active amplifying circuits 221 and 222 (which are corresponding to gain stages Avb1 and Avb2 of FIG. 1b respectively) and the active amplifying circuits 221 and 222 are coupled to each other. The active amplifying circuits 221 and 222 include a transistor M13 (e.g. an N-type transistor) and a transistor M14 (e.g. an N-type transistor) respectively. The transistors M13 and M14 have e.g. a source, a gate and a drain. The source of the transistor M13 receives a ground voltage VSS, the gate of the transistor M13 is coupled to a terminal of the capacitance Cz wherein the other terminal of the capacitance Cz receives a ground voltage VSS, and the drain of the transistor M13 receives the compensating signal Sa1. The source of the transistor M14 receives a ground voltage VSS, the gate of the transistor M14 is coupled to the drain of the transistor M13, and the drain of the transistor M14 is coupled to a drain of the transistor M12. In addition, the resistance Rz is coupled between the drain of the transistor M13 and the gate of the transistor M13.

As described above, locating a pole P2 (which is corresponding to P2 in the embodiment of FIGS. 1a and 1b) to a high frequency requires the minimization of a parasitic capacitance of the transistor M13 (a relatively large Rz is necessary to generate the 1/RzCz-zero) and therefore the active left half plane zero circuit 122 should be as compact as possible. To accomplish this, both a gain Gmb1 (which is corresponding to −Gmb1 of FIG. 1b) of the transistor M13 and a gain Gmb2 (which is corresponding to −Gmb2 of FIG. 1b) of the transistor M14 are embodied in the frequency compensation unit 120 to avoid extra parasitic capacitance. The transistors M13 and M14 are formed as a current mirror circuit and thus a current I6 at the drain of the transistor M14 is mirrored out according to a current I5 at the drain of the transistor M13. According to an embodiment of the invention, a current mirror ratio of 2:3 is designed for the size ratio of the transistor M14 versus the transistor M13 so as to minimize the parasitic capacitance induced by the transistor M14 while shifting a pole P1 (which is corresponding to P1 in the embodiment of FIGS. 1a and 1b).

According to an embodiment of FIG. 2, the output driving unit 130 includes a transistor M15 (e.g. an N-type transistor) and a transistor M16 (e.g. a P-type transistor). The transistors M15 (which is corresponding to the gain stage Av3) and M16 (which is corresponding to the gain stage Avfw) have e.g. a source, a gate, and a drain. The source of the transistor M15 receives a ground voltage VSS, the gate of the transistor M15 receives the second stage output signal Sp2, and the drain of the transistor M15 generates the third stage output signal Vo. In addition, the source of the transistor M16 receives a power voltage VDD, the gate of the transistor M16 receives the first stage output signal Sp1, and the drain of the transistor M16 is coupled to the drain of the transistor M15. Since the gate of the transistor M16 is coupled to the drain of the transistor M10, an output driving current I7 is provided according to the current I4 and also according to the current I1.

According to an embodiment of the invention, the output driving unit 130 could be regarded as a third gain stage. The third stage output signal Vo is obtained by coupling the signal amplified from the second stage output signal Sp2 having a gain GmL (which is corresponding to −GmL of FIG. 1a) through the transistor M15 with the signal amplified from the first stage output signal Sp1 having a gain Gmf (which is corresponding to −Gmf of FIG. 1a) through the transistor M16. Thus, the transistor M15 is combined with the transistor M16 to form a push-pull structure. For an nF-range load capacitance CL (not shown) at the output of the amplifier 200, the slew rate of the amplifier 200 is dominated by the maximum charging or discharging current I7 at the output driving unit 130.

According to an embodiment of FIG. 2, the Miller compensation capacitance Cm is coupled between the output of the amplifier 200 and an input of the current buffer circuit 114, that is, the Miller compensation capacitance Cm is coupled between the drain of the transistor M15 and the source of the transistor M8. Accordingly, the Miller compensation capacitance Cm contributes a feedback component from the third stage output signal Vo to the transporting signal St2. Since the Miller compensation capacitance Cm is coupled to the frequency compensation unit 120 which is composed of two amplifying circuits (the current buffer circuit 114 & the cascode amplifying circuit 215) in series, the Miller compensation capacitance Cm and the frequency compensation unit 120 are formed as current-buffer Miller compensation (CBMC) circuit. CBMC can perform better frequency compensation than standard Miller compensation. Moreover, CBMC still shows better stability, power and area efficiencies than the standard Miller compensation counterpart. In addition, the phase margin (which is used to measure the stability of a system) of CBMC is still higher than that of standard Miller compensation.

Figure 4:
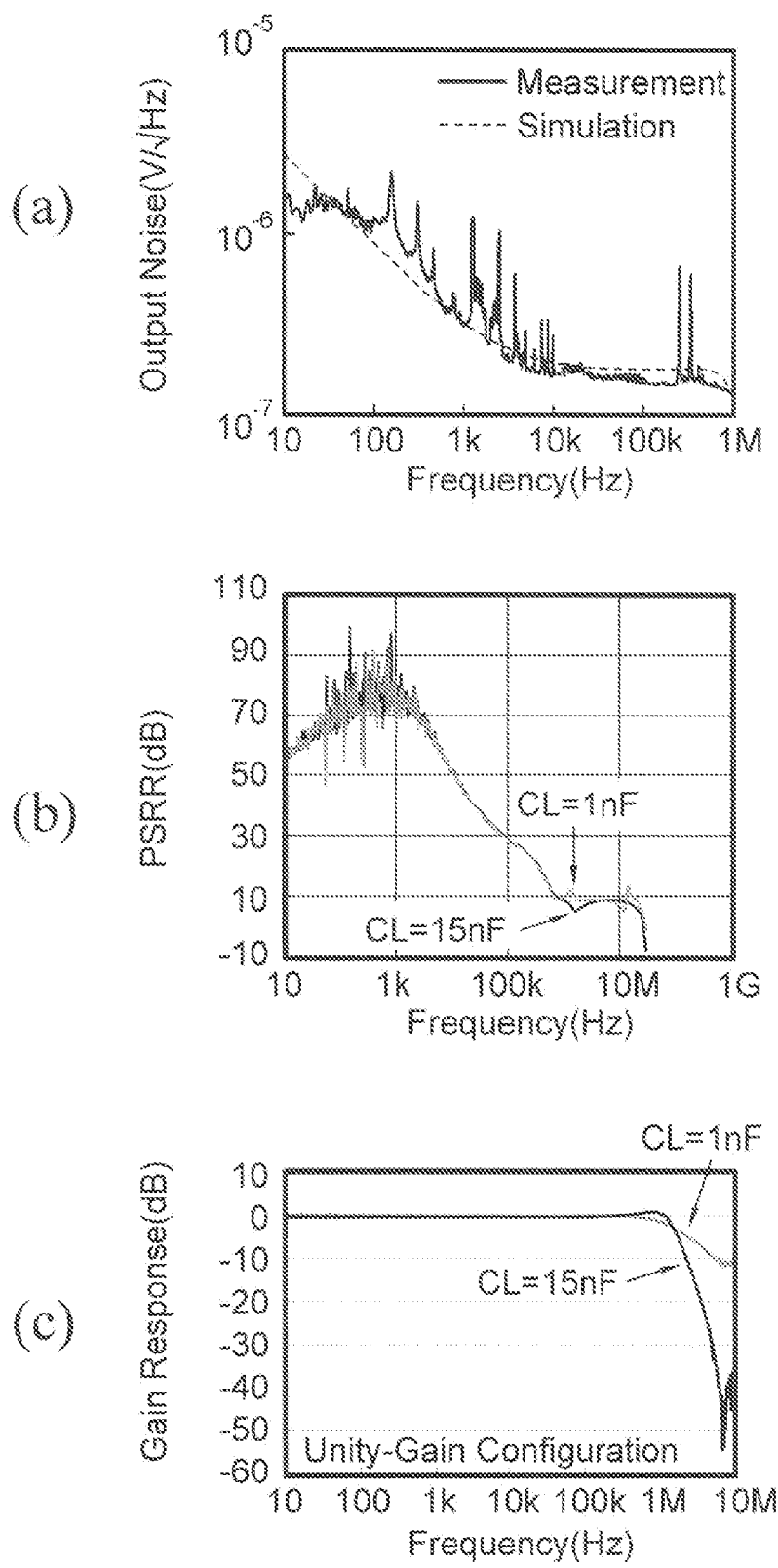
FIG. 4a shows an output noise density of the amplifier 200 according to an embodiment of the invention.
FIG. 4b shows power-supply rejection ratio (PSRR) of the amplifier 200 according to an embodiment of the invention.
FIG. 4c shows a gain response in unity-gain feedback of the amplifier 200 according to an embodiment of the invention.

FIG. 4a shows an output noise density of the amplifier 200 according to an embodiment of the invention, FIG. 4b shows power-supply rejection ratio (PSRR) of the amplifier 200 according to an embodiment of the invention, and FIG. 4c shows a gain response in unity-gain feedback of the amplifier 200 according to an embodiment of the invention. Configured as a unity-gain feedback amplifier the measured output noise density spectrum (FIG. 4a) shows that the 1/f noise corner is close to 4 kHz and the white noise is 174 nV/√Hz at 100 kHz, which is in good agreement with the simulated result. The discrepancy at low frequency (<30 Hz) is due to the AC coupling capacitor (100 µF) in the test setup. From simulations for the transistors M3-M4 and M9-10 (FIG. 2) are the major contributors to the noise, with 52.6% and 32.4%, respectively, at 100 kHz. The PSRR is around 80 dB at 1 kHz (FIG. 4b). The unity-gain magnitude responses at 1-nF and 15-nF CL are shown in FIG. 4c. The −3-dB bandwidth at 15-nF CL is larger due to the existence of the complex poles.

Figure 5:
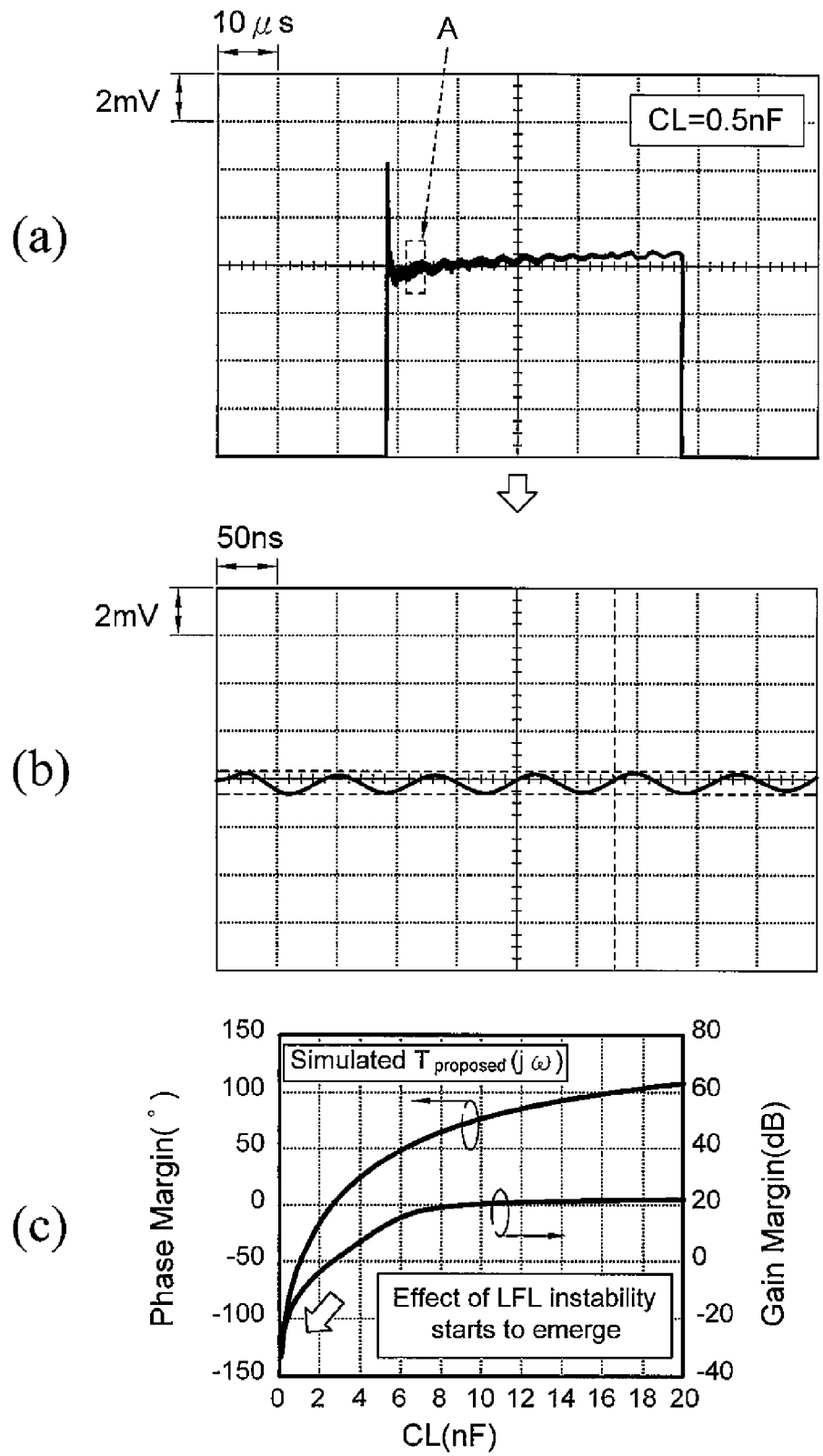

FIG. 5a shows a measured step response at CL=0.5 nF of the amplifier 200 according to an embodiment of the invention, FIG. 5b shows an enlarged waveform in a portion A of FIG. 5a, and FIG. 5c shows the simulated gain and phase margins of the amplifier 200 according to an embodiment of the invention. Although the measured gain (7.8 dB) and phase (79.5°) margins are not inferior when CL is downsized to 0.5 nF, a small (~0.9 mVpp), long-lasting, high-frequency (~42 MHz) ringing appears in the step response (FIG. 5a), which suggests that the closed-loop transfer function has a second-order polynomial with a very small damping factor and a high damping frequency. From an LFL analysis perspective this can be explained as follows: when CL is significantly reduced, a damping factor according to amplifier 200 decreases considerably, as well as a closed-loop damping factor. For a certain reduced value of CL a long-lasting ringing occurs in the step response (FIG. 5b). The degradation on the LFL's PM and GM can capture the reduction in the damping factor, since they are an indirect indicator of the ringing. When CL is further downsized to e.g. 0.1 nF, the amplifier 200 may have lower phase margin (PM) and gain margin (GM) both internally (LFL) and externally (unity-gain feedback). This observation is consistent with the simulated gain and phase margins as shown in FIG. 5c. Consequently, the lower bound of CL should be determined by the LFL stability, while the upper bound of CL should be judged by the stability margins of the amplifier's transfer function.

In summary, the present invention presents a three-stage amplifier. The design and implementation of a power-efficient (144 µW) and compact (0.016 mm$^2$) three-stage amplifier with large-and-wide CL drivability (1 to 15 nF) have been presented. Wherein, the optimized frequency compensation scheme is CBMC plus parasitic-pole cancellation. Its transistor-level implementation is made particularly effective via a wideband current buffer and an active LHP zero circuit. Thus, since all the compensation circuits are built inside the amplifier, no external resistors are required so as to improve the cost, settling time and high frequency gain of the amplifier.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. A Three stage amplifier comprising:
   first, second and third gain stages wherein said first stage receives an amplifier input signal and said third gain stage outputs an amplifier output signal;
   a feedback loop having a current buffer and a compensation capacitance provided from the output of said third gain stage to the output of the first gain stage;
   a feedforward transconductance stage extending from the output of said first gain stage to the output of said third gain stage; and
   an active left half plane zero stage embedded in said feedback loop for cancelling a parasitic pole of said feedback loop.

2. The amplifying device as claimed in claim 1, wherein said current buffer circuit comprises:
   a first transistor, having a source receiving a ground voltage, having a gate receiving a first bias voltage, and having a drain receiving the first transporting signal;
   a second transistor, having a source receiving a ground voltage, having a gate receiving the first bias voltage, and having a drain receiving the first transporting signal;
   a third transistor, having a source receiving the first transporting signal, having a gate receiving a second bias voltage, and having a drain generating a first current buffer signal; and
   a fourth transistor, having a source receiving the second transporting signal, having a gate receiving a third bias voltage, having a drain generating a second current buffer signal, and the source of the fourth transistor coupled to the Miller compensation capacitance.

3. An amplifier as claimed in claim 1 wherein said active left half plane zero stage includes two gain stages, and a feedback loop including a resistance and a second compensation capacitance.

4. The active left half plane zero stage as claimed in claim 2 wherein said two gain stages in are negative gain stages.

5. The active left half plane zero stage as claimed in claim 3 wherein said two gain stages in are negative gain stages.

6. An amplifier as claimed 1 where said active left half plane zero stage is embedded inside the second stage.

7. An amplifier as claimed 1 where said active left half plane zero stage is embedded inside the output stage.

8. A three stage amplifier comprising:
   first, second and third gain stages wherein said first gain stage receives an amplifier input signal and said third gain stage outputs an amplifier output signal;
   a feedback loop having a current buffer and a compensation capacitance provided from the output of said third gain stage to the output of the first gain stage; and
   an active left half plane zero stage embedded in said feedback loop for cancelling a parasitic pole of said feedback loop comprising two gain stages, one gain stage including a feedback loop including a resistance and a second compensation capacitance.

9. An amplifier as claimed in claim 8 further comprising a feedforward transconductance stage extending from the output of said first gain stage to the output of said third gain stage.

10. An amplifier as claimed in claim 8 wherein said active left half plane zero stage is embedded inside the output stage.

11. An amplifier as claimed in claim 8 wherein said active left half plane zero stage is embedded inside the third stage.

12. An amplifier as claimed in claim 9 wherein said active left half plane zero stage is embedded inside the output stage.

13. An amplifier as claimed in claim 9 wherein said active left half plane zero stage is embedded inside the second stage.

14. A three stage amplifier comprising:
   first, second and third gain stages wherein said first gain stage receives an amplifier input signal and said third gain stage outputs an amplifier output signal;
   a feedback loop having a current buffer and a compensation capacitance provided from the output of said third gain stage to the output of the first gain stage;
   a feedforward transconductance stage extending from the output of said first gain stage to the output of said third gain stage; and
   an active left half plane zero stage embedded in the feedback loop for cancelling a parasitic pole of said feedback loop.

15. A three stage amplifier comprising:
   first, second and third gain stages wherein said first gain stage receives an amplifier input signal and said third gain stage outputs an amplifier output signal;
   a feedback loop having a current buffer and a compensation capacitance provided from the output of said third gain stage to the output of the first gain stage;

a feedforward transconductance stage extending from the output of said first gain stage to the output of said third gain stage; and an active left half plane zero stage embedded in the second stage for cancelling a parasitic pole of said feedback loop.

16. A three stage amplifier comprising:

first, second and third gain stages wherein said first gain stage receives an amplifier input signal and said third gain stage outputs an amplifier output signal;

a feedback loop having a current buffer and a compensation capacitance provided from the output of said third gain stage to the output of the first gain stage;

a feedforward transconductance stage extending from the output of said first gain stage to the output of said third gain stage; and an active left half plane zero stage embedded in the output stage for cancelling a parasitic pole of said feedback loop.

* * * * *